Figure 2:
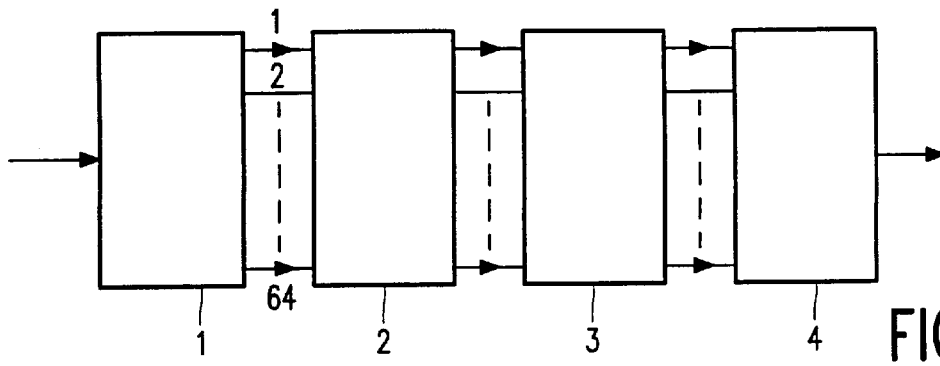

United States Patent [19]

Van Der Vleuten et al.

[11] Patent Number: 6,157,326

[45] Date of Patent: *Dec. 5, 2000

[54] METHOD OF AND DEVICE FOR CODING A DIGITAL INFORMATION SIGNAL

[75] Inventors: Renatus J. Van Der Vleuten; Alphons A. M. L. Bruekers, both of Eindhoven, Netherlands

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/813,418

[22] Filed: Mar. 10, 1997

[30] Foreign Application Priority Data

Mar. 15, 1996 [EP] European Pat. Off. ............ 96200729
Dec. 20, 1996 [EP] European Pat. Off. ............ 96203651

[51] Int. Cl.$^7$ ........................................... H03M 7/40
[52] U.S. Cl. .................................................. 341/65
[58] Field of Search ........................ 341/51, 65, 67, 341/106

[56] References Cited

U.S. PATENT DOCUMENTS 4,546,342  10/1985  Weaver et al. ............... 340/347 DD
5,227,789   7/1993  Barry et al. ....................... 341/65
5,504,484   4/1996  Wilson ................................ 341/67

*Primary Examiner*—Brian Young
*Assistant Examiner*—John Nguyen

[57] ABSTRACT

The invention relates to the coding of digital information signal blocks comprising representation symbols, such as sampled values, by means of an adaptive variable-length coding, such as Huffman coding. The JPEG Standard also utilizes adaptive Huffman coding but the coding in accordance with this standard is inefficient when a comparatively large number of Huffman coding tables are to be transmitted. According to the invention, in the case of a small number of representation symbols per information signal block, the probabilities of occurrence of each of the representation symbols are transmitted together with the variable-length-coded representation symbols, a similar (de)coding table being generated both in the encoder and in the decoder on the basis of said probabilities. In the case of a larger number of representation symbols per information signal block information about the number of code words of each length and/or the maximum code length in each series of variable-length-coded representation symbols is added to this series. By means of this information the decoder can unambiguously generate a coding table. The invention provides a substantial reduction of the number of bits required for specifying the Huffman code tables.

47 Claims, 4 Drawing Sheets

| REPR. SYMB. | CODE WORD |
|---|---|
| 0 | 0 0 |
| 1 | 0 1 0 |
| 2 | 0 1 1 |
| 3 | 1 0 0 0 |
| 4 | 1 0 0 1 |
| 5 | 1 0 1 0 |
| 6 | 1 0 1 1 |
FIG. 1a
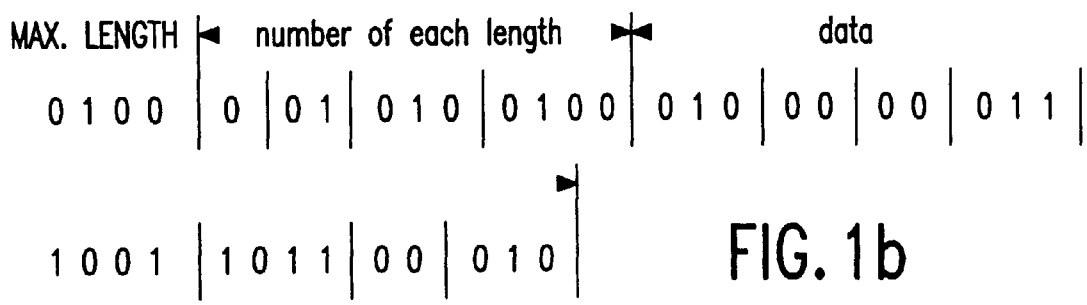
FIG. 1b
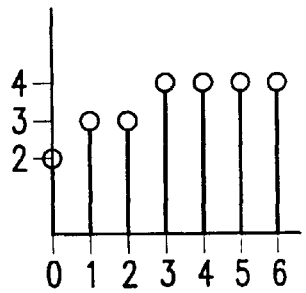
FIG. 1c
| REPR. SYMB. | CODE WORD | TRANSM. INF. |
|---|---|---|
| 0 | 0 0 | 0 0 1 0 |
| 1 | 0 1 0 | 0 0 1 1 |
| 2 | 0 1 1 | 0 0 1 1 |
| 3 | 1 0 0 0 | 0 1 0 0 |
| 4 | 1 0 0 1 | 0 1 0 0 |
| 5 | 1 0 1 0 | 0 1 0 0 |
| 6 | 1 0 1 1 | 0 1 0 0 |
FIG. 1d

METHOD OF AND DEVICE FOR CODING A DIGITAL INFORMATION SIGNAL

The invention relates to a method of and device for efficiently coding digital information signals. In such a method an information signal is sampled and quantized in order to obtain representation symbols, which representation symbols, if necessary after further processing, are subsequently coded into code words having different code word lengths.

In accordance with the JPEG standard, as described in, for example, the book "JPEG Still Image Compression Standard" by William P. Pennebaker and Joan C. Mitchell, it is known to use codes referred to as Huffman codes for the coding of sampled quantized signals. A Huffman code can be specified completely by defining the number of code words of any possible code word length. The JPEG standard utilizes either fixed Huffman tables, in which a fixed symbol is assigned to each code, or adaptive Huffman tables, in which a code table is determined on the basis of the frequency of occurrence of symbols. In accordance with the JPEG standard a representation symbol is also transmitted for each code word in the case of adaptive tables. A Huffman coding is based on the idea that an efficient coding with code words of different lengths is possible if the shortest code word length is assigned to those code words which occur most frequently.

According to the JPEG standard the code words have a length which varies from 1 to 16 and a representation symbol is assigned to each code word, which representation symbols range from 0 to 255.

The coding in accordance with the JPEG standard is not efficient enough for certain uses, which is particularly so when it is required to transmit a comparatively large number of adaptive Huffman tables for a comparatively small amount of data.

Therefore, it is an object of the invention to provide a method and a device enabling the data relating to the Huffman table specification to be transmitted more efficiently than possible with the Huffman codes as defined in the JPEG standard.

To this end, in a method of the type defined in the opening paragraph, according to a first aspect of the invention, only the plurality of code words of each length of the quantized signal is transmitted and at the receiving side a given representation symbol n is assigned to the shortest code word and increasingly longer code words are assigned to consecutive representation symbols in a decoder. According to this aspect the invention is based on the recognition of the fact that the representation symbols for audio and video signals are distributed typically symmetrically, for example in accordance with a Gaussian distribution, in such a manner that, when it is assumed that the representation symbols are situated symmetrically relative to the symbol value n and decrease substantially monotonically relative to this value, the representation symbols whose code words have the smallest lengths occur most frequently and those whose code words have the greatest lengths occur least frequently. However, in order to preclude errors owing to the fact that the actual representation symbols are not transmitted, it is necessary that there is a code word for each possible value of a representation symbol. As use is made of the fact that the distribution is symmetrical, it is necessary that in the case of an odd number of representation symbols a sign bit is added to each representation symbol which is ≠n, to indicate whether a representation symbol is greater or smaller than n. A sign bit is also allocated to the representation symbol n in the case of an even number of representation symbols.

In accordance with a second aspect of the invention, in addition to the code words, information about the code word of the greatest length occurring in the transmitted signal is transmitted. In accordance with the JPEG standard for all code words having a length of 1–16 the number of codewords is specified by means of an 8-bit number, which means that in total this requires a table of 16×8=128 bits.

On the basis of the recognition that the greatest codeword length that actually occurs will frequently be much smaller than 16, a more efficient coding table can be obtained by merely transmitting the number of codewords of each length that occur and, in addition, the maximum code word length. For example, when the maximum code word length L=5 and the maximum permissible length is 16, this requires 4 bits in order to accommodate the greatest code word length in an additional data field. Since there are never more than $2^L$ code words having the length L, only L bits are required in order to define the number of code words of the length L. For L=5, in accordance with the invention, the table consequently consists of 4+1+2+3+4+5=19 bits, which is a distinct improvement as compared with the above-mentioned 128 bits.

Obviously, it is possible to combine the advantages of the first and the second aspect of the invention.

In accordance with a third aspect of the invention an even more efficient coding is obtained with a method in accordance with the second aspect of the invention by minimizing the sum of the number of bits necessary for specifying the table and the number of bits necessary for coding the actual data. When the maximum code word length that is assigned decreases less bits are needed to specify the table but more bits are needed to code the data, because the efficiency of the code decreases as the maximum permissible code word length is reduced. By stepwise reducing the permissible code word length and at the same time monitoring the total number of bits necessary for transmitting the information, it is possible to find the optimum code word length for which the total number of bits to be transmitted is minimal.

It is known that in the case that there are few different representation symbols, for example 7 representation symbols, the efficiency of the Huffman coding can be increased in that a plurality of such representation symbols are grouped into a symbol or a vector of greater length. The efficiency of a Huffman code is guaranteed within 1 bit/representation symbol of the entropy of the signal comprising the representation symbols, which means that in the case of a small number of representation symbols the Huffman code is comparatively inefficient. This is solved by said grouping.

When groups of representation symbols are used the solution, described as the first aspect of the invention, cannot be used in order to increase the efficiency because the classification of the groups on the basis of their likelihood of occurrence depends on the probability of the representation symbols of which a group consists.

In accordance with a fourth aspect of the invention this problem is solved by transmitting the quantized probabilities of the original representation symbols. The probabilities, which can be determined by determining the number of times that each representation symbols occurs and dividing this number by the total number of representation symbols in the information signal, can be quantized in, for example, 32 levels.

The number of quantized probabilities can be reduced if in the case of an odd number of representation symbols the distribution of the representation symbols is symmetrical, so that $p(n+K)=p(n-K)$, where n=the central representation symbol, use being made of the fact that the sum of the probabilities is 1. Then, only $((N+1)/2)-1$ probabilities have to be transmitted for N representation symbols. For a symmetrical distribution where N=3, for example, only $p(n)$ needs to be given, because $p(n+1)=p(n-1)$ and $p(n-1)+p(n)+p(n+1)=1$.

In the case of an even number of N representation symbols similar considerations apply and only $N/2-1$ probabilities have to be transmitted.

In accordance with the above principle the probability of the grouped samples is computed on the basis of the transmitted probabilities both in the encoder and in the decoder, by means of the same algorithm. This is effected by multiplying the probabilities of the individual samples by one another. For example, the probability of the group $(n,n,n+1)$ is calculated by $p(n,n,n+1)=p(n)\cdot p(n)\cdot p(n+1)$. Then, a Huffman code is generated for this vector, the coding used by the encoder and the decoder being obviously the same.

In the case that the distribution of the representation symbols is symmetrical only half the number of representation symbols is used for grouping, which considerably reduces the size of the code. For each representation symbol in the group a sign bit is added to the Huffman code word; in the case of an odd number of representation symbols no sign bit needs to be assigned to the representation symbol n.

As long as the encoder and the decoder use the same method of generating the Huffman codes any method leading to a Huffman coding can be used. If Huffman codes of the JPEG type are used, it is advantageous that the greatest code word length that occurs can be limited in a simple manner.

If the probabilities of occurrence of each representation symbol are transmitted in the manner described above, it is also possible to use other variable-length coding techniques, such as arithmetic coding, in which case it is not necessary to form groups of representation symbols.

The methods of coding an information signal in accordance with the invention are particularly suitable for use in a digital audio transmission system in which the signal is divided into subbands and in which the subbands or combinations of subbands are coded by means of the techniques described above for the transmission of the coding information. This means that if the number of representation symbols in (a combination of) subbands is small, for example 3, 5 or 7, the probability of occurrence of each of the symbols is transmitted in order to enable the same coding table to be generated in the encoder and the decoder, grouping of representation symbols being possible. If the number of representation symbols in (a combination of) subbands is larger, for example larger than 9, use is made of the exclusive transmission of information about the number of code words of each length, each code word being associated with a representation symbol, if required in combination with information about the longest code word that occurs.

According to a fifth aspect of the invention an efficient adaptive Huffman coding is provided in the case that the adaptation frequency of the Huffman tables is high, i.e. the tables are adapted a large number of times per unit of time, and at the same time the number of representation symbols in the information signal to be transmitted comprises all or nearly all permissible representation symbols, as can be the case in, for example, audio and video signals.

In accordance with this aspect of the invention only the length of the associated Huffman code is transmitted for each possible representation symbol. The actual Huffman code words can be derived from this information in an unambiguous manner, as will be explained hereinafter. This requires in the first place that both in the encoder and in the decoder a similar list of symbols is available and the Huffman code word lengths are transmitted in the sequence of this list, while in the second place the Huffman code words derived from the code word lengths are assigned to the symbols in a pre-defined manner. In contrast with the first four aspects of the invention this fifth aspect is not based on any assumptions with respect to the probability of occurrence of symbols in the signal to be transmitted.

Figure 3A:
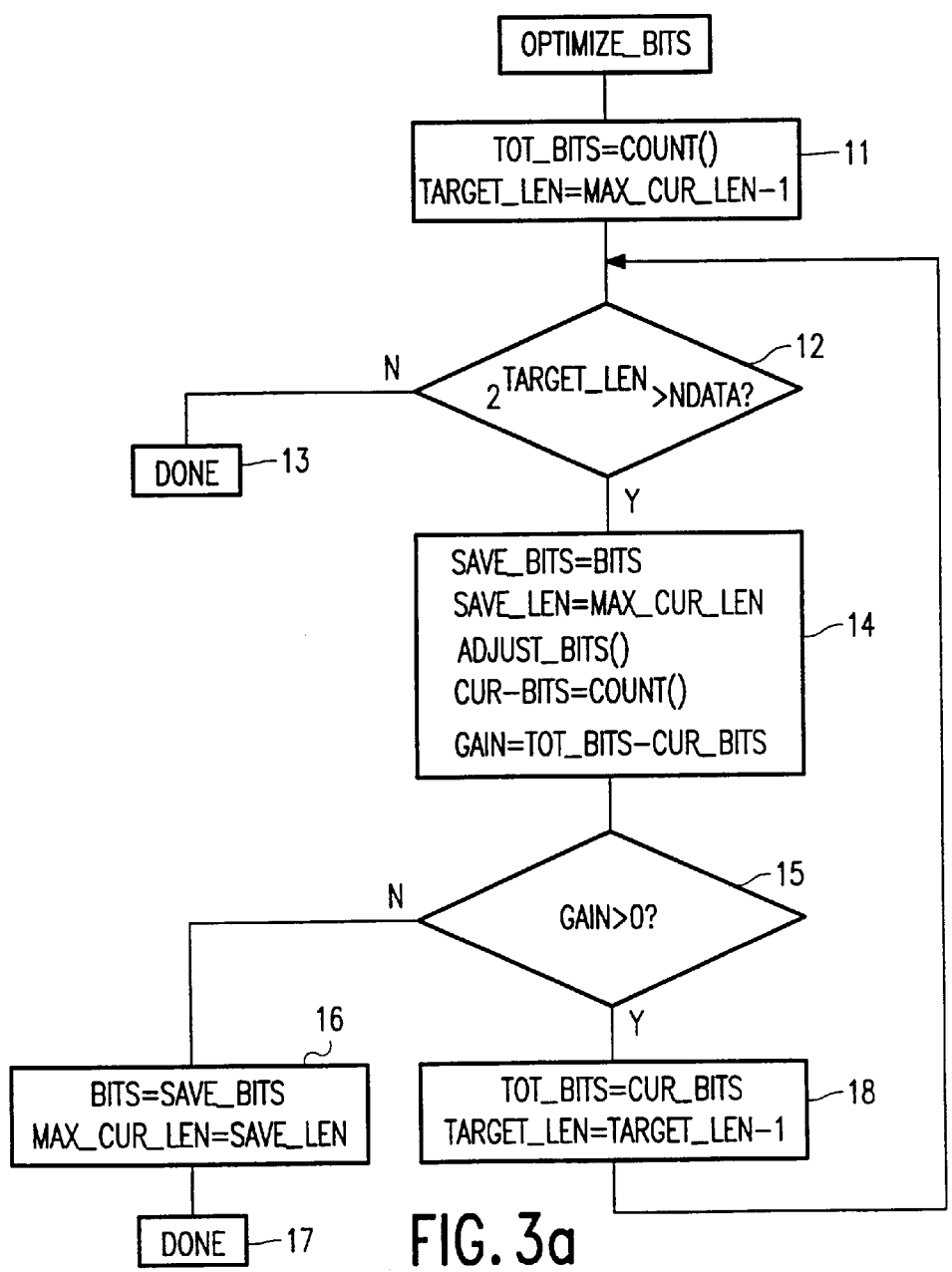
Figure 4:
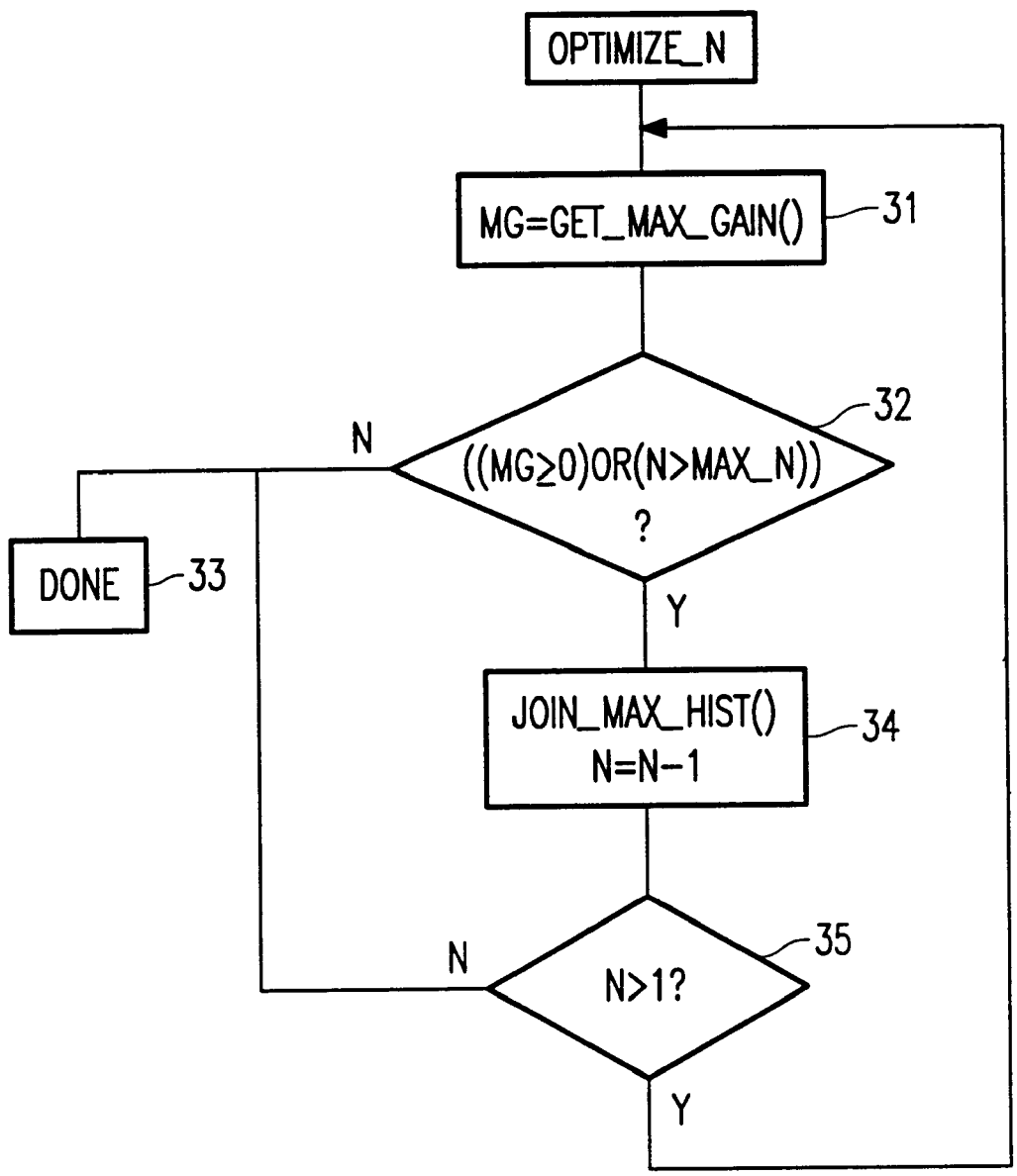

The invention will now be described in more detail with reference to the drawings. In the drawings:

FIGS. 1 a–d show examples of a Huffman coding in accordance with a first, second and fifth aspect of the invention;

FIG. 2 is a block diagram of a transmission system for a digital audio signal using the coding in accordance with the invention;

FIGS. 3a, b show a diagram of a method of minimizing the number of bits to be transmitted; and FIG. 4 is a flow chart of a method of reducing the number of bits of the code-table information.

The following example is based on a sampled quantized signal represented by 7 representation symbols or sample values 0–6. An encoder determines the probability of occurrence of each of these 7 representation symbols in the signal block to be transmitted, which can be a signal frame or a subframe, and on the basis thereof a code word of variable length is assigned to each of these representation symbols in accordance with the well-known Huffman coding principle, as described inter alia in the afore-mentioned "JPEG Still Image Compression Standard".

FIG. 1a shows the series of representation symbols and the code words assigned thereto by way of example. As is apparent from FIG. 1a, there is a code word of a length 2, there are two code words of a length 3 and four code words of a length 4. In accordance with the invention information is transmitted about the code word having the greatest length that occurs, in the present case the length 4. In the case of a maximum permissible length 16 this information can be represented by: 0 1 0 0. Subsequently, information about the number of code words of each length is transmitted, a length L requiring a maximum of L bits. In the present example these codes are consequently: 0; 01; 010; 0100. Finally, the codes for the actual representation symbols are transmitted. If the series of representation symbols 1-0-0-2-4-6-0-1 is taken by way of example, the bit series for this symbol series in accordance with FIG. 1a is: 010-00-00-011-1001-1011-00-010. The total bit stream transmitted is shown in FIG. 1b.

On the basis of this received bit stream the decoder first determines that the maximum code word length is 4 and which representation symbol belongs to which code word. This is possible because the Huffman coding in accordance with JPEG unambiguously defines the code words: code words of a given length (L) for consecutive representation symbols are defined by binary counting and, upon a change to a code word whose length is 1 bit greater (L+1), the existing code word of the length L is first binarily incremented by one and subsequently a 0 is inserted adjacent the least significant bit, after which binary counting proceeds for subsequent code words of the same length. This principle is illustrated in the Table of FIG. 1a.

FIG. 1c shows diagrammatically how the decoder determines which code word belongs to which representation symbol. Subsequently, the decoder can derive the original series of representation symbols on the basis of the received coded representation symbols, as shown in FIG. 1b.

FIG. 1d shows how for the example of FIG. 1a the information about the Huffman code words is transmitted in accordance with the fifth aspect of the invention. For each possible symbol only the length of the associated Huffman code is transmitted. FIG. 1d again shows the same representation symbols in the left-hand column, the Huffman code words of the example in accordance with FIG. 1a in the center column, and the transmitted information in the right-hand column. In the case of n possible code words having a maximum lengths of L bits L×n bits must be transmitted.

For the conventional transmission in accordance with the JPEG standard the number of bits in the case of, for example, 256 symbols is equal to the number of bits required for the information about the number of code words of each length, for example y bits, plus 256×8 bits for specifying the symbol associated with each code word. This is (256×8)+y bits in total.

With the method in accordance with the fifth aspect of the invention only 256×4 bits are required in the case of Huffman code words having a maximum length of 16, which can be coded by 4 bits (the length 0 does not occur), i.e. less than half the number of bits required in accordance with the JPEG standard.

In the case of the method in accordance with this fifth aspect of the invention the decoder calculates the histogram of the code word lengths as a basis for the calculation of the Huffman code word associated with each symbol in accordance with the unique relationship between the Huffman codes and the code word lengths thereof. However, if desired, this histogram can alternatively be calculated in the encoder and the histogram information can be transmitted to the decoder in an efficient manner. This can be effected, for example, in accordance with the standard JPEG method but also by the method in accordance with the first and/or the second aspect of the invention. It is likewise possible to use the optimization method in accordance with the third aspect of the invention.

A further efficiency increase can be achieved by using some form of entropy coding to specify the code word lengths, utilizing the information that in general long code words appear more often than short code words. Such entropy coding can be fixed or adaptive.

If all the possible symbols are not used it is also possible to transmit first the information about the symbols actually used to the decoder and subsequently to transmit also the code word length for these representation symbols only.

Finally, besides the transmission of the code word length in accordance with the fifth aspect of the invention, it is also possible to employ the transmission of Huffman codes in accordance with the first and/or the second aspect of the invention, an extra bit being used to indicate to the decoder which of the two techniques has been selected for the transmission of the Huffman code word information.

FIG. 2 shows diagrammatically a block diagram of a device for transmitting a digital audio signal as a bit stream, the bit stream comprising a minimal number of bits which yet enables the digital audio signal to be reconstructed in a receiver.

In FIG. 2 a subband filter bank 1 receives the sampled and quantized digital audio signal and in known manner splits this into, for example, 64 subbands. Each of the subbands is divided into subframes, each comprising for example 24 symbol representations. A number of, for example, 3 subframes forms one frame. In a quantization unit 2 the subframes of each of the subbands are quantized into a given number of representation symbols, for example $-2^{15}-2^{15}$ symbols. This quantization is greater than that used for the quantization of the signal applied to the filter bank 1.

A variable-length coding unit 3 combines all subbands of all subframes having an equal number of representation symbols. This is allowed, because it is assumed that the probability density function for all these subbands is the same. For each combination with an equal given number of representation symbols the probability of occurrence of each of the representation symbols is determined. This is effected simply by counting the number of each of the representation symbols and dividing this number by the total number of representation symbols. Since it has been assumed that the distribution of the probabilities of the representation symbols is symmetrical, $p(n+K)=p(n-K)$, where n is the central representation symbol. If the number of representation symbols is small, for example 3, 5 or 7, the probabilities for each representation symbol are transmitted and both the encoder and the decoder define an identical variable-length coding table, for example a Huffman coding table, on the basis of these values. If a Huffman coding is employed, the representation symbols may first be arranged in groups, for example groups of 3 representation symbols, an individual Huffman codeword being assigned to each group, as set forth hereinbefore. The codes for each group, in the case of Huffman coding, or for each representation symbol are subsequently transmitted and in a receiver the decoder can derive the actual representation symbols from these codes.

The total number of bits necessary for transmitting the (groups) of representation symbols and the information about the probabilities, which information is needed to generate the same (de)coding table in the encoder and the decoder, is constantly checked and compared with the number of bits necessary when for the representation symbols code words of a fixed length are selected. If a fixed-length coding requires a smaller number of bits than the variable-length coding, the first-mentioned coding is used. Such a situation can occur if there are few samples for a given number of representation symbols and the table specification consequently requires a comparatively large number of additional bits.

When the number of representation symbols is greater, for example 9 or more, the variable-length coding unit 4 utilizes a Huffman coding in accordance with the first and/or the second aspect of the invention, in which case either merely the number of code words of each length is transmitted and/or the code words of the greatest code word length. This technique may be combined with reduction of the greatest code word length and testing whether this results in a reduction of the total number of bits required for transmitting the code table information and the actual codes which the representation symbols represent.

FIGS. 3a, b is a flow chart showing the steps to be performed in order to realize this.

Input variables for this process are: BITS=the number of codewords of each length required; N DATA=the total number of code words; and MAX-CUR-LEN=the current maximum length of a code word.

Figure 3B:
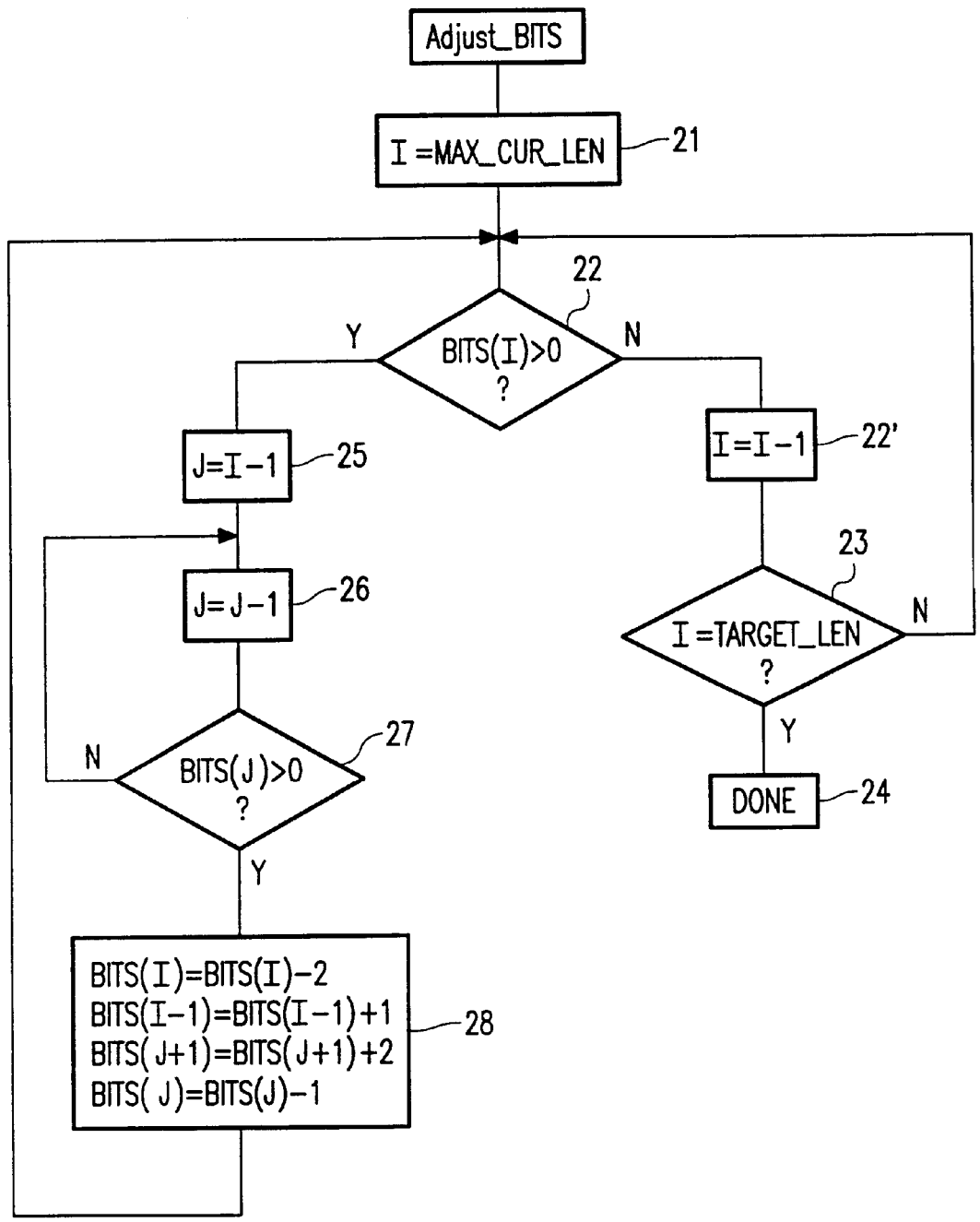

In a block 11 the total number of bits required is counted and the target code word length (TARGET-LEN) is equalized to MAX-CUR-LEN−1. In a decision block 12 it is ascertained whether $2^{TARGET-LEN}$>N DATA. If this is not the case, a further code word length reduction is not possible and the process is terminated in a block 13. If said requirement is met, the length of the code words having the highest length is reduced by one in a block 14 by means of a sub-process adjust-BITS, illustrated in FIG. 3b.

The adjust-BITS process is a variant of the process used in the JPEG standard in order to ensure that there is no code of a length greater than a predetermined length. This process is described in Appendix A of ISO-DIS 10918-1.

In a block 21 the I is set to MAX__CUR__LEN. In a decision block 22 it is ascertained whether there are I-bit code words; if this is not the case, I becomes I=I−1 in the block 22; and it is decided whether I=TARGET-LEN in a block 23, if yes, the adjust-BITS process is terminated in the block 24 and, if no, the program returns to the block 22.

If there are code words of I bits, this yields J=I−1 in a block 25 and J=J−1 in a block 26. In a decision block 27 it is determined whether there are J-bit code words. If there are no such code words, the program returns to the block 26, and if there are such code words the changes indicated in a block 28 are carried out. As a result of this, the code words of the greatest length (I), which always appear in pairs, are removed in pairs and replaced by two shorter code words. After this has been completed, the loop is traversed again until I=TARGET-LEN.

Furthermore, in the block 14 the GAIN is determined, i.e. the number of bits prior to code word reduction is reduced to the number of bits after this reduction, i.e. TOT-BITS-CUR-BITS. If in a block 15 it appears that GAIN≦0, the process is terminated in blocks 16, 17 and, if this is not the case, the loop is traversed again via a block 18.

Also in this case, regardless of the techniques used for transmitting the coding information, it is ascertained whether it is perhaps more efficient to use a coding with fixed-length code words and, if this is the case, no Huffman coding is used.

When a Huffman coding is selected it can also be attempted to reduce the total number of bits required for the code table information by combining Huffman codes for different numbers of representation symbols. It is possible, for example, to code 3 representation symbols with a table for 5 representation symbols, which may less efficient but which enables only one instead of two coding information tables to be transmitted.

FIG. 4 is a flow chart for a process OPTIMIZE-N, which is suitable for this purpose.

Input variables for this process are the level histogram for each Huffman code; N=the total number of Huffman codes, and MAX-N=the predetermined maximum permissible number of codes.

In a block 31 MG is equalized to GET-MAX-GAIN. In the GET-MAX-GAIN subroutine the gain is determined which is obtained by the combination of Huffman codes for a number of levels and the next higher level, the combination yielding the highest gain in bits being selected. In a decision block 32 it is determined whether MG≧0 or whether N>MAX-N. If one of the two conditions is not met, the process is stopped in a block 33. The comparison N>MAX-N ? is effected because as long as N>MAX-N the process is also allowed to proceed if MG≦0. If MG≧0 or N>MAX-N, the combination of histograms selected in a block 34 is effectuated and N=N−1. If in a block 35 it is found that N≦1, the process is terminated in the block 33, whereas if N>1 the loop is traversed again.

The invention is particularly suitable for frame-based coding of representation symbol sources, as occurring in audio and video coding systems, for example symbol sources, without memory and with similar probability density functions.

What is claimed is:

1. A method comprising:

providing an information signal;

sampling and quantizing the information signal to obtain representation symbols;

encoding the representation symbols to obtain code words, including assigning a code word value to each different representation symbol value, in accordance with a predetermined coding technique, some of the code words having different lengths than other code words;

determining the number of different representation symbol values in the coded information signal block;

generating a first type of coded information signal block, containing a first type of decoding information, if the number of different values of the symbols is greater than or equal to a predetermined number, and generating a second different type of coded information signal block, containing a second different type of decoding information, if the number of different values of the symbols is smaller than the predetermined number, the coded blocks containing the encoded representation symbols of the information signal, the decoding information indicating which representation symbol value or values each code word value represents, the decoding information depending on other information about the symbols or code words than that on which the type of decoding information depends; and transmitting the first or second types of coded block.

2. The method of claim 1, in which the first type of decoding information includes information indicating the number of code words of each permissible length which are present and information identifying the code words which represent the coded representation symbols.

3. The method of claim 1, in which the first type of decoding information includes information indicating the length of the longest code word present in the coded block.

4. The method of claim 1, in which symbol encoding includes in the case of an even number of representation symbols, assigning a sign bit to each code word, and in the case of an odd number of representation symbols, assigning a sign bit to each code word except for the code word representing a central representation symbol.

5. The method of claim 1 in which the first type of decoding information includes information indicating the length of the code word value representing each representation symbol value.

6. The method of claim 2, in which the method further comprises: stepwise reducing the maximum code word length of the first type of decoding information; continuously ascertaining whether this reducing results in significant reduction of the total number of bits present in the coded block; and terminating the reducing when significant reduction in the total number of bits is no longer obtained.

7. The method of claim 1, in which: the method further comprises determining the probability of occurrence of each representation symbol for the coded block; and the decoding information includes the probability of occurrence of each representation symbol.

8. The method of claim 7, in which symbol encoding includes Huffman encoding.

9. The method of claim 7, in which: the method further comprises grouping the representation symbols into vectors or multiple representation symbols; and the symbol encoding includes encoding the vectors.

10. The method of claim 1, in which:
the predetermined coding technique includes: determining the probability of occurrence of each different value of the representation symbols; assigning code word values of a smaller length to represent representation symbols with values having a higher probability of occurrence; and assigning code words values of a greater length to represent representation symbols with values having a low probability of occurrence;
the first type of decoding information indicating the number of code words of each permissible length in the block and information indicating the code word values which represent the representation symbol values;
the first type of decoding information includes information indicating the length of the longest code word present in the coded block;
symbol encoding includes in the case of an even number of representation symbols, assigning a signal bit to each code word, and in the case of an odd number of representation symbols, assigning a sign bit to each code word except for the code word representing the central representation symbol;
the first type of decoding information includes information indicating the length of the code word value representing each representation symbol value;
the method further comprises the steps of: stepwise reducing the maximum code word length appearing in the first type of coded block; continuously ascertaining whether this reducing results in significant reduction of the total number of bits present in the coded block; and terminating the reducing when significant reduction of the total number of bits is no longer obtained;
the second type of decoding information includes information indicating the probability of occurrence for each representation symbol value in the coded block;
symbol encoding includes Huffman encoding;
the method further includes grouping the representation symbols into vector of multiple representation symbols; and the symbol encoding includes encoding the vectors;
the method further comprises encoding the code word lengths using entropy coding;
symbol encoding includes calculating a histogram of the code word lengths;
transmitting includes transmitting the coded information block to a decoder;
the method further comprises decoding the transmitted information block depending on the transmitted information indicating the length of the code word associated with the representation symbols, including calculating a histogram of the code word lengths and determining the Huffman code associated with each representation symbol based on the histogram; and
the decoding information includes information indicating the length of the code word associated with only the representation symbols that are actually used among the possible representation symbols.

11. A method, comprising:
providing an information signal;
sampling and quantizing the information signal to obtain representation symbols;
encoding the representation symbols into code words of different code word lengths in accordance with a predetermined coding technique;
generating a coded information signal block containing the information indicating the length of the code word value associated with each representation symbol value in the coded block and containing the encoded representation symbols of the information signal; and
transmitting the coded block.

12. The method of claim 11, in which the symbol encoding includes Huffman encoding the representation symbols.

13. The method of claim 11, in which the method further comprises encoding the code word lengths using entropy coding.

14. The method of claim 11, in which the symbol encoding includes calculating a histogram of the code word lengths.

15. The method of claim 11, in which:
the transmitting includes transmitting the coded information block to a decoder; and
the method further comprises decoding the transmitted information block depending on the transmitted information indicating the length of the code word values associated with the different representation symbol values, and including calculating a histogram of the code word lengths and determining the Huffman code associated with each representation symbol value based on the histogram.

16. The method of claim 11, in which generating the coded block includes providing in the coded block, information indicating the length of the code word value associated with each possible different representation symbol value.

17. The method of claim 11, in which generating the coded block includes providing in the coded block, information indicating the length of the code word value associated with only the representation symbol values that are actually used among the possible representation symbol values.

18. The method of claim 11, in which:

the predetermined coding technique includes: determining the probability of occurrence of each representation symbol value; assigning code word values of a smaller length to the representation symbol values having a high probability of occurrence; and assigning code words values of a greater length to representation symbol values having a low probability of occurrence;

encoding the representation symbols includes Huffman coding;

the method further comprises encoding the code word lengths using entropy encoding;

symbol encoding includes calculating a histogram of the code word lengths;

transmitting includes transmitting the coded information block to a decoder;

the method further comprises the step of decoding the transmitted information block depending on the transmitted information indicating the length of the code word associated with the representation symbols, including calculating a histogram of the code word lengths and determining the Huffman code associated with each representation symbol based on the histogram;

the generating includes providing in the coded block, information indicating the length of the code word associated with only the representation symbols that are actually used among the possible representation symbols;

symbol encoding includes in the case of an even number of representation symbols, assigning a signal bit to each code word, and in the case of an odd number of representation symbols, assigning a sign bit to each code word except for the code word representing the central representation symbol;

the method further comprises: stepwise reducing the maximum code word length appearing in the first type of coded block; ascertaining whether this results in significant reduction of the total number of bits present in the coded block; and terminating the reducing when significant reduction of the number of bits is no longer obtained;

generating the coded block includes providing in the block, information indicating the probability of occurrence for each different value of representation symbols in the coded block;

encoding includes encoding a number of representation symbols grouped into a longer symbol generating the coded block includes providing in signal block, information indicating the number of code words of each permissible length which are present;

generating the coded block includes providing in the signal block, information indicating the length of the longest code word present in the coded block.

19. A device comprising:

means for sampling and quantizing an information signal to obtain representation symbols;

means for encoding the representation symbols with codes having different lengths;

means for determining a number of different representation symbols for a coded information signal block;

means for generating a first type of coded information signal block containing a first type of decoding information and the code words for the encoded representation symbols, if the number is greater than or equal to a predetermined number; and means for generating a second type of coded information signal block containing a second type of decoding information and the code words for the encoded representation symbols, if the number is smaller than the predetermined number.

20. The device of claim 19, in which the means for generating the first type of coded block are for providing in the coded block, information indicating the number of code words of each permissible length which are present in the coded block.

21. The device of claim 19, in which the means for generating the first type of coded blocks are for providing in the coded block, information indicating the greatest length of a code word present in the coded block.

22. The device of claim 19, in which the means for generating the first type of coded block are for providing in the coded block, information indicating the greatest length of the code word associated with each representation symbol.

23. The device of claim 19, in which:

the means for generating the second type of coded block are for providing in the coded block, information indicating the probability of occurrence of each of the representation symbols; and the means for forming codes are for grouping the representation symbols coded groups of a predetermined number of representation symbols.

24. The device of claim 19, in which:

the encoding means is for determining the probability of occurrence of each of the representation symbols; for assigning code words of a smaller length to the representation symbols having a high probability of occurrence; and for assigning code words of a greater length to representation symbols having a low probability of occurrence;

the means for generating the first type of coded block are for providing in the coded block, information indicating the number of code words of each permissible length which are present in the coded block;

the means for generating the first type of coded blocks are for providing in the coded block, information indicating the length of a code word present in the coded block;

the means for generating the first type of coded block are for providing in the coded block, information indicating the length of the code word associated with each representation symbol;

the means for generating the second type of coded block are for providing in the coded block, information indicating the probability of occurrence of each of the representation symbols in the second type of block;

the means for forming codes are for providing the representation symbols grouped into coded groups of a predetermined number of representation symbols; and the device further includes means for calculating a histogram of the code word lengths.

25. A system for providing programmed structures in a programmable device, comprising:

apparatus to provide means for sampling and quantizing an information signal to obtain representation symbols;

apparatus to provide means for determining the probability of occurrence of each representation symbol;

apparatus to provide means for forming codes having variable length for different representation symbols, which codes are combined into a representation symbol block;

apparatus to provide means for determining the number of different representation symbols in an information signal block;

apparatus to provide means for generating a first type of coded block containing the code words, if the number is greater than or equal to a predetermined number; and apparatus to provide means for generating a second type of coded block containing the code words, if the number is less than a predetermined number.

26. The system of claim 25 in which:

the system consists essentially of programmed computer media;

the means for generating the first type of coded block are for including information indicating the number of code words of each permissible length which are present in the coded block;

the means for generating the first type of coded blocks are for providing in the coded block, information indicating the length of a code word present in the coded block;

the means for generating the first type of coded block are for providing in the coded block, information indicating the length of the code word associated with each representation symbol;

the means for generating the second type of coded block are for including information indicating the probability of occurrence of each of the representation symbols in the second type of block;

the means for sampling and quantizing are for providing the representation symbols grouped into coded groups of a predetermined number of representation symbols;

the system further comprises apparatus for providing means for calculating a histogram of the code word lengths.

27. A device comprising:

means for sampling and quantizing an information signal to obtain representation symbols;

means for determining a probability of occurrence of each representation symbol;

means for encoding the representation symbols into codes having different lengths;

means for generating a coded information block containing the codes for the encoded representation symbols and information indicating the length of the code word associated with each representation symbol.

28. The device of claim 27, in which the device further comprises means for calculating a histogram of the code word lengths.

29. The device of claim 27, in which:

the device further comprises means for calculating a histogram of the code word lengths;

the means for forming codes are for providing the representation symbols grouped into coded groups of a predetermined number of representation symbols;

the device further comprises: means for determining a number of different representation symbols for a coded information signal block; means for generating a first type of coded information signal block containing the code words, if the number is greater than or equal to a predetermined number; and means for generating a second type of coded information signal block containing the code words, if the number is smaller than the predetermined number;

the means for generating the first type of coded block are for including information indicating the number of code words of each permissible length which are present in the coded block;

the means for generating the first type of coded blocks are for providing in the coded block, information indicating the length of a code word present in the coded block;

the means for generating the first type of coded block are for providing in the coded block, information indicating the length of the code word associated with each representation symbol; and the means for generating the second type of coded block are for including information indicating the probability of occurrence of each of the representation symbols in the second type of block.

30. A method of transmitting information:

sampling and quantizing an information signal with a predetermined sampling and quantizing technique to compress the information signal into symbols with values that have different probabilities of occurrence;

determining the frequency of occurrence of each different symbol value in a portion of all or part of the information signal;

adaptively assigning different code word values to represent different symbol values for the portion of the signal and in which some of the code word values are of a different bit length than other code word values, shorter code word values are assigned to represent more frequently occurring symbol values, and longer code word values are assigned to represent less frequently occurring symbol values;

encoding the portion of the information signal with code words representing the symbols of the sampled and quantized information signal according to the adaptive assigning;

transmitting a list of code words including a code word value for each possible symbol value in a predetermined order of the symbol values so that a decoder can determine which code word value in the list represents each possible symbol value without requiring the transmission of a table of code words and symbols defining which code word value represents each symbol value; and transmitting the encoded information signal with the code words representing the symbols.

31. The method of claim 30 further comprising transmitting information indicating the greatest code word length in the portion of the information signal and in which the list of code words only includes code words up to the maximum code word length.

32. A method of transmitting information:

sampling and quantizing an information signal with a predetermined sampling and quantizing technique to compress the information signal into symbols with values that have different probabilities of occurrence;

determining the frequency of occurrence of each different symbol value in a portion of all or part of the information signal;

adaptively assigning different code word values to represent different symbol values for the portion of the signal and in which some of the code word values are of a different bit length than other code word values, shorter code word values are assigned to represent more frequently occurring symbol values, and longer code word values are assigned to represent less frequently occurring symbol values;

encoding the portion of the information signal with code words representing the symbols of the sampled and quantized information signal according to the assigning;

transmitting the greatest code word length in the portion of the information signal; and transmitting the encoded information signal with the code words representing the symbols.

33. The method of claim 31 further comprising transmitting a list of code words including a code word value for each possible symbol value up to the maximum symbol value occurring in the portion, in a predetermined order of the symbol values so that a decoder can determine which code word values in the list represents each occurring symbol value without requiring the transmission of a table of code words and symbols defining the symbol value that each code word value represents.

34. A method of transmitting information:

sampling and quantizing an information signal with a predetermined sampling and quantizing technique to compress the information signal into symbols with values that have different probabilities of occurrence;

determining the frequency of occurrence of each different symbol value in a portion of all or part of the information signal;

adaptively assigning different code word values to represent different symbol values for the portion of the signal and in which some of the code word values are of a different bit length than other code word values, shorter code word values are assigned to represent more frequently occurring symbol values, and longer code word values are assigned to represent less frequently occurring symbol values;

encoding the portion of the information signal with code words representing the symbols of the sampled and quantized information signal according to the assigning;

transmitting the number of code words of each different code word length in the portion of the information signal; and transmitting the encoded information signal with the code words representing the symbols.

35. The method of claim 34 further comprising transmitting information indicating the greatest code word length in the portion of the information signal.

36. A method of transmitting information:

sampling and quantizing an information signal with a predetermined sampling and quantizing technique to compress the information signal into symbols with values that have different probabilities of occurrence;

determining the frequency of occurrence of each different symbol value in a portion of all or part of the information signal;

adaptively assigning different code word values to represent different symbol values for the portion of the signal and in which some of the code word values are of a different bit length than other code word values, shorter code word values are assigned to represent more frequently occurring symbol values, and longer code word values are assigned to represent less frequently occurring symbol values;

reducing the sum of the number of bits required for transmitting the encoded information signal together with decoding information for determining which symbols the code words represent, using a stepwise reduction in the maximum length of the code words until the total number of bits required to transmit the information is no longer substantially reduced;

encoding the portion of the information signal with code words representing the symbols of the sampled and quantized information signal according to the reducing;

transmitting decoding information for determining which symbols the code words represent; and transmitting the encoded information signal with the code words representing the symbols.

37. The method of claim 36 in which the decoding information includes the greatest code word length in the portion of the information signal.

38. The method of claim 36 in which the decoding information includes the number of code words of each code word length in the portion of the information signal.

39. A method of transmitting information:

sampling and quantizing an information signal with a predetermined sampling and quantizing technique to compress the information signal into symbols with values that have different probabilities of occurrence;

determining the frequency of occurrence of each different symbol value in a portion of all or part of the information signal;

adaptively assigning different code word values to represent different symbol values for the portion of the signal and in which some of the code word values are of a different bit length than other code word values, shorter code word values are assigned to represent more frequently occurring symbol values, and longer code word values are assigned to represent less frequently occurring symbol values;

encoding the portion of the information signal with code words representing the symbols of the sampled and quantized information signal according to the reducing;

transmitting the number of symbols of a symbol value or the quantized probabilities of the symbol value in the portion; and transmitting the encoded information signal with the code words representing the symbols.

40. The method of claim 39 in which the adaptive assigning is based on Hoffman encoding.

41. The method of claim 39 in which the original symbols are grouped into vectors of greater length.

42. The method of claim 39 in which the distribution of symbol values is symmetrical and only about half of the probabilities are transmitted so that the remaining probabilities can be determined based on the symmetry.

43. A method of transmitting information:

sampling and quantizing an information signal with a predetermined sampling and quantizing technique to compress the information signal into symbols with values that have different probabilities of occurrence;

determining the frequency of occurrence of each different symbol value in a portion of all or part of the information signal;

adaptively assigning different code word values to represent different symbol values for the portion of the signal and in which some of the code word values are of a different bit length than other code word values, shorter code word values are assigned to represent more frequently occurring symbol values, and longer code word values are assigned to represent less frequently occurring symbol values;

encoding the portion of the information signal with code words representing the symbols of the sampled and quantized information signal according to the reducing;

determining the number of different symbol values used in the encoding;

selecting a type of decoding information for determining during decoding, which symbol values the code word values represent, the type of decoding information depending on the number of different values of the symbols, and the decoding information depending on the type of decoding information and another characteristic of the symbols or code words;

transmitting the decoding information depending on the selection; and transmitting the encoded information signal with the code words representing the symbols.

44. The method of claim 43 in which, when the number of different symbol values is small, the selected type of decoding information includes the number of symbols of each different symbol value or the quantized probabilities of the symbol value in the portion.

45. The method of claim 43 in which, when the number of different symbol values is large the selected type of decoding information includes the number of different code word values of each code word length.

46. A method of transmitting information:

sampling and quantizing an information signal with a predetermined sampling and quantizing technique to compress the information signal into symbols with values that have different probabilities of occurrence;

determining the frequency of occurrence of each different symbol value in a portion of all or part of the information signal;

adaptively assigning different code word values to represent different symbol values for the portion of the signal and in which some of the code word values are of a different bit length than other code word values, shorter code word values are assigned to represent more frequently occurring symbol values, and longer code word values are assigned to represent less frequently occurring symbol values;

encoding the portion of the information signal with code words representing the symbols of the sampled and quantized information signal;

transmitting the length of the code word value assigned to represent each possible symbol value; and transmitting the encoded information signal with the code words representing the symbols.

47. The method of claim 46 in which the possible symbol values being predetermined or information limiting the possible symbol values being transmitted.

* * * * *